United States Patent
Harris et al.

(10) Patent No.: US 11,023,821 B2
(45) Date of Patent: Jun. 1, 2021

(54) EMBEDDING OF A CONDENSED MATTER SYSTEM WITH AN ANALOG PROCESSOR

(71) Applicant: D-WAVE SYSTEMS INC., Burnaby (CA)

(72) Inventors: Richard G. Harris, North Vancouver (CA); Kelly T. R. Boothby, Coquitlam (CA); Andrew D. King, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 642 days.

(21) Appl. No.: 15/881,260

(22) Filed: Jan. 26, 2018

(65) Prior Publication Data

US 2018/0218280 A1    Aug. 2, 2018

Related U.S. Application Data

(60) Provisional application No. 62/451,518, filed on Jan. 27, 2017.

(51) Int. Cl.
| | |
|---|---|
| *G06N 10/00* | (2019.01) |
| *H01L 39/22* | (2006.01) |
| *H01L 49/00* | (2006.01) |
| *H01L 39/00* | (2006.01) |

(52) U.S. Cl.
CPC ........... *G06N 10/00* (2019.01); *H01L 39/223* (2013.01); *H01L 49/006* (2013.01); *H01L 39/00* (2013.01)

(58) Field of Classification Search
CPC ..... G06N 10/00; H01L 39/223; H01L 49/006; H01L 39/00
See application file for complete search history.

(56) References Cited

U.S. PATENT DOCUMENTS

| | | | |
|---|---|---|---|
| 9,170,278 B2 | 10/2015 | Neufeld | |
| 9,178,154 B2 | 11/2015 | Bunyk | |
| 9,940,586 B1* | 4/2018 | Epstein | ............... G06N 10/00 |
| 10,248,491 B1* | 4/2019 | Zeng | .................. G06N 10/00 |
| 2011/0238607 A1* | 9/2011 | Coury | ............... G06T 11/206 |
| | | | 706/46 |

(Continued)

FOREIGN PATENT DOCUMENTS

| | | |
|---|---|---|
| WO | 2006/066415 A1 | 6/2006 |
| WO | 2017/075246 A1 | 5/2017 |

*Primary Examiner* — Rehana Perveen
*Assistant Examiner* — Steven W Crabb
(74) *Attorney, Agent, or Firm* — Cozen O'Connor (57) ABSTRACT

A system and method of operation embeds a three-dimensional structure in a topology of an analog processor, for example a quantum processor. The analog processor may include a plurality of qubits arranged in tiles or cells. A number of qubits and communicatively coupled as logical qubits, each logical qubit which span across a plurality of tiles or cells of the qubits. Communicatively coupling between qubits of any given logical qubit can be implemented via application or assignment of a first ferromagnetic coupling strength to each of a number of couplers that communicatively couple the respective qubits in the logical qubit. Other ferromagnetic coupling strengths can be applied or assigned to couplers that communicatively couple qubits that are not part of the logical qubit. The first ferromagnetic coupling strength may be substantially higher than the other ferromagnetic coupling strengths.

7 Claims, 7 Drawing Sheets

(56) References Cited

U.S. PATENT DOCUMENTS

| | | | |
|---|---|---|---|
| 2012/0319684 A1* | 12/2012 | Gambetta | H01L 39/04 |
| | | | 324/304 |
| 2014/0097405 A1* | 4/2014 | Bunyk | H01L 39/22 |
| | | | 257/31 |
| 2018/0032894 A1* | 2/2018 | Epstein | G06N 10/00 |
| 2019/0305037 A1* | 10/2019 | Michalak | H01L 27/18 |
| 2020/0065439 A1* | 2/2020 | Babbush | G06F 30/20 |

* cited by examiner

EMBEDDING OF A CONDENSED MATTER SYSTEM WITH AN ANALOG PROCESSOR

FIELD

This disclosure generally relates to simulation of three-dimensional structures using an analog processor.

BACKGROUND

Quantum Devices

Quantum devices are structures in which quantum mechanical effects are observable. Quantum devices include circuits in which current transport is dominated by quantum mechanical effects. Such devices include spintronics, and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing.

A quantum processor may be designed to perform quantum annealing and/or adiabatic quantum computation. An evolution Hamiltonian can be constructed that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and A(t), B(t) are coefficients that can control the rate of evolution, and typically lie in the range [0,1].

In some implementations, a time varying envelope function can be placed on the problem Hamiltonian. A suitable delocalization Hamiltonian is given by:

$$H_D \propto -\frac{1}{2}\sum_{i=1}^{N} \Delta_i \sigma_i^x$$

where N represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms.

A common problem Hamiltonian includes a first component proportional to diagonal single qubit terms and a second component proportional to diagonal multi-qubit terms, and may be of the following form:

$$H_P \propto -\frac{\varepsilon}{2}\left[\sum_{i=1}^{N} h_i \sigma_i^z + \sum_{j>i}^{N} J_{ij} \sigma_i^z \sigma_j^z\right]$$

where N represents the number of qubits, $\sigma_i^z$ is the Pauli z-matrix for the $i^{th}$ qubit, $h_i$ and $J_{ij}$ are dimensionless local fields for the qubits, and couplings between qubits, and $\varepsilon$ is some characteristic energy scale for $H_P$.

Here, the $\sigma_i^z$ and $\sigma_i^z \sigma_j^z$ terms are examples of "diagonal" terms. The former is a single qubit term and the latter a two qubit term.

Throughout this specification, the terms "problem Hamiltonian" and "final Hamiltonian" are used interchangeably unless the context dictates otherwise. Certain states of the quantum processor are, energetically preferred, or simply preferred by the problem Hamiltonian. These include the ground states but may include excited states.

Hamiltonians such as $H_D$ and $H_P$ in the above two equations, respectively, may be physically realized in a variety of different ways. A particular example is realized by an implementation of superconducting qubits.

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Degeneracy

In a quantum mechanical system, an energy level is said to be degenerate if the energy level can correspond to two or more different measurable states. Two or more different states of a quantum mechanical system are said to be degenerate if they can correspond to the same energy level. A quantum binary digit, known as a qubit, is a two-state quantum mechanical system. If flipping a qubit from a first of the two states to a second of the two states does not affect the energy of the system, then the two states are said to be degenerate.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need to be able to process at least some problems having size and/or connectivity greater than (and/ or at least not fully provided by) the working graph (i.e., physical topology or structure) of an analog processor. Computational systems and methods are described which, at least in some implementations, allow for the computation of at least some problem graphs which have representations which do not fit within the working graph of an analog processor (e.g., because they require more computation devices and/or more/other couplers than the processor provides).

A system to embed a three-dimensional structure may be summarized as including a plurality of cells tiled over an area such that each cell is positioned proximately adjacent at least one other cell, each cell respectively comprising: a first set of qubits; a second set of qubits, wherein a portion of at least one qubit in the first set of qubits crosses a portion of at least one qubit in the second set of qubits; a first set of intra-cell couplers, wherein each of the intra-cell couplers is positioned proximate a region where one of the qubits in the first set of qubits crosses one of the qubits in the second set of qubits and provides tunable communicative coupling between one of the qubits in the first set of qubits and one of the qubits in the second set of qubits; and a first set of inter-cell couplers, wherein each of the inter-cell couplers is located proximate a first end of each of the qubits in the first set of qubits and a first end of each qubit in the second set of qubits and wherein each inter-cell coupler provides tunable communicative coupling between one of the qubits in the first set of qubits and one of the qubits in the first set of qubits in an adjacent cell or between one of the qubits in the second set of qubits and one of the qubits in the second set of qubits in an adjacent cell, wherein for a number of sets of two or more of the cells, the qubits of cells in the set of cells are communicatively coupled as one or more logical qubits, each of the logical qubits respectively comprising: at least one qubit in the first set of qubits of a first cell of the respective set of cells, at least one qubit in the second set of qubits in the first cell of the respective set of cells, communicatively coupled to the at least one qubit in the first set of qubits of the first cell of the respective set of cells; at least one qubit in the first set of qubits in a second cell of the respective set of cells communicatively coupled to the at least one qubit in the first set of qubits of the first cell of the respective set of cells, the second cell adjacent to the first cell of the respective set of cells; and at least one qubit in the second set of qubits in a third cell of the respective set of cells communicatively coupled to the at least one qubit in the second set of qubits of the first cell, the third cell adjacent to at least the first cell of the respective set of cells; and wherein each logical qubit is communicatively coupled to at least one other logical qubit within the plurality of cells. Each coupler in each logical qubit may have a first ferromagnetic coupling strength, and each logical qubit may be communicatively coupled to at least one logical qubit via couplers that have second coupling strength, wherein the first ferromagnetic coupling strength may be greater in magnitude than the second coupling strength. The three-dimensional structure may be a three-dimensional lattice. Each logical qubit may be coupled to at least three other logical qubits.

A method of embedding a three-dimensional structure within a plurality of cells tiled over an area an area such that each cell is positioned proximately adjacent at least one other cell, each cell comprising a first set of qubits, a second set of qubits, wherein a portion of at least one qubit in the first set of qubits crosses a portion of at least one qubit in the second set of qubits, a first set of intra-cell couplers, wherein each of the intra-cell couplers is positioned proximate a region where one of the qubits in the first set of qubits crosses one of the qubits in the second set of qubits and provides tunable communicative coupling between one of the qubits in the first set of qubits and one of the qubits in the second set of qubits; and a first set of inter-cell couplers, wherein each of inter-cell couplers is located proximate a first end of each of the qubits in the first set of qubits and a first end of each qubits in the second set of qubits and wherein each inter-cell coupler provides tunable communicative coupling between one of the qubits in the first set of qubits and one of the qubits in the first set of qubits in an adjacent cell or between one of the qubits in the second set of qubits and one of the qubits in the second set of qubits in an adjacent cell may be summarized as including forming a set of logical qubits, each logical qubit formed by: assigning a first ferromagnetic coupling strength to a coupler communicatively coupling at least one qubit in the first set of qubits to at least one qubit in the second set of qubits within a cell; assigning the first ferromagnetic coupling strength to a coupler communicatively coupling the at least one qubit in the first set of qubits to at least one qubit in the first set of qubits in an adjacent cell; and assigning the first ferromagnetic coupling strength to a coupler communicatively coupling the at least one qubit in the second set of qubits to at least one qubit in the second set of qubits in an adjacent cell; and forming a three-dimensional structure by coupling each logical qubit to at least one other logical qubit by assigning a second coupling strength to each coupler communicatively coupling pairs of logical qubits.

The first ferromagnetic coupling may be greater in magnitude than the second coupling strength.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
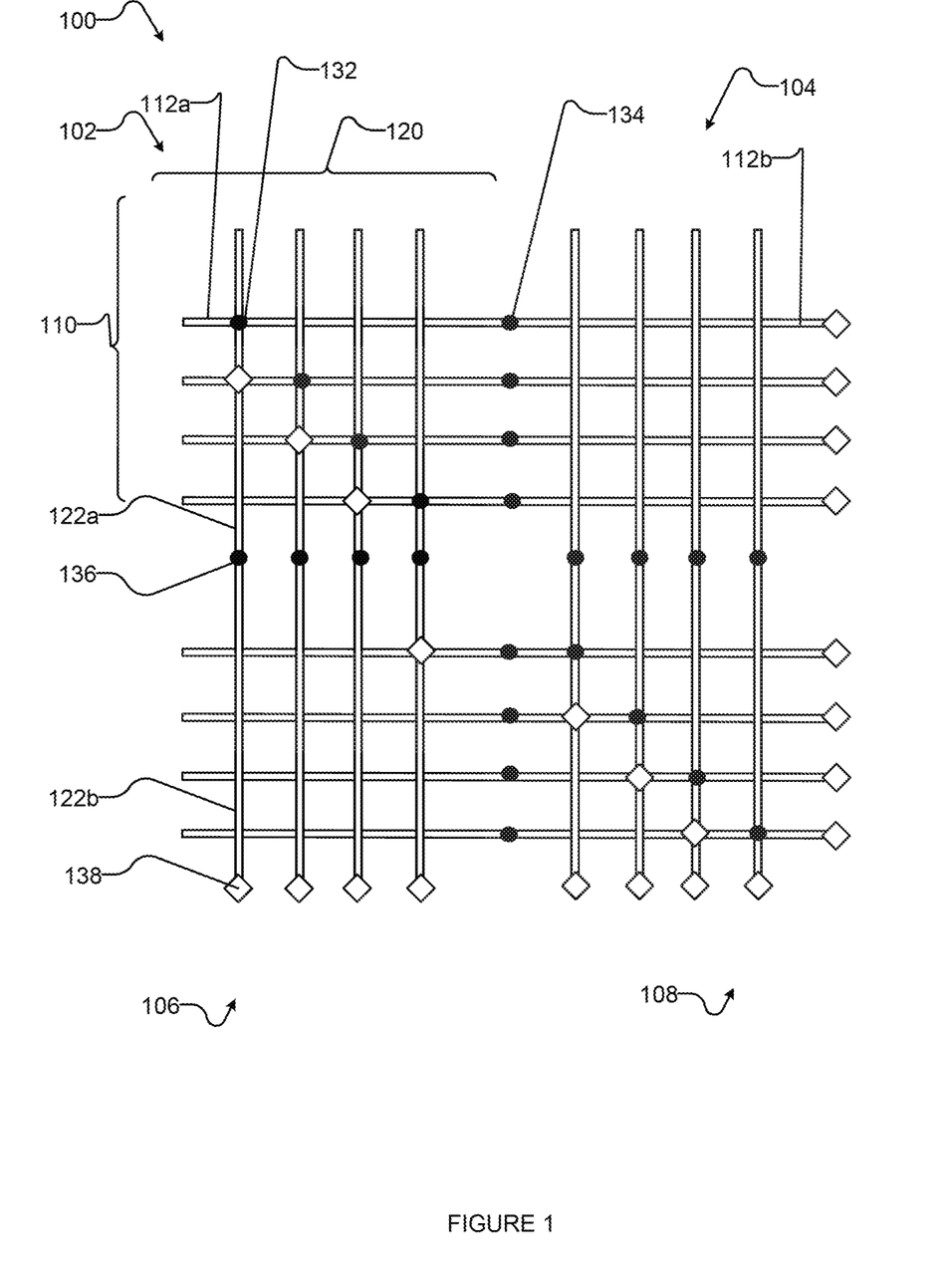
FIG. 1 is a composite diagram of a photograph of an analog processor (e.g., a quantum processor) with an example embedding of a 3-dimensional lattice imposed on the working graph or topology of the analog processor.

FIG. 1 is a schematic diagram showing an example embedding of a 3-dimensional, or cubic, lattice into a working graph or structural topology of an analog processor 100, e.g., a quantum processor.

An L×L×L cubic lattice may be embedded by representing individual Ising spins using $L^3$ strongly coupled chains of flux qubits—also referred to as logical qubits—and selecting a subset of inter-qubit couplers to represent the nearest neighbors of the cubic lattice. In this application and the appended claims, L is defined as the number of logical qubits communicatively coupled to one another in a given direction of the cubic lattice.

Schematic diagram may be a portion of an analog processor 100, for example a quantum processor. The illustrated analog processor 100 or portion thereof comprises four cells 102-108 tiled over an area, where each cell has a fixed topology, and where each cell is next to at least one other cell.

In FIG. 1, each cell 102-108 is represented having a Chimera topology; however, a person skilled in the art will understand that the teachings of this application and the appended claims are relevant to other types of analog processor topology. Details of the Chimera topology and other topologies may be found in International Patent Application WO2006066415, U.S. Pat. Nos. 9,170,278 and 9,178,154.

Each cell 102-108 has a first set of qubits 110 and a second set of qubits 120 (the first and second set of qubits 110, 120 are called out for only one cell 102 to prevent clutter in the illustration). Each qubit in the first set of qubits 110 is parallel to one another along a respective longitudinal axis and each qubit in the set 120 is parallel to one another along a respective longitudinal axis. Each qubit in the first set of qubits 110 crosses a portion of the qubits in the second set of qubits 120. For the purpose of this application and the appended claims, the term 'cross', and variants thereof such as crosses or crossing, includes meet, underlie, overlie, overlap, come together or are proximate one another. In some implementations, the qubits in the first set of qubits 110 are orthogonal to the qubits in the second set of qubits 120.

A coupler may be present proximate where one qubit in first set of qubits 110 crosses one qubit in second set of qubits 120 to provide tunable communicative coupling. In addition, couplers may be present where a first end of one qubit in first set of qubits 110 is proximate to a first end of a qubit in a respective first set of qubits 110 in an adjacent cell to provide tunable communicative coupling between cells. For example, coupler 134 provides communicative coupling between a first qubit in the first set of qubits 110 of first cell 102 and a first qubit in the first set of qubits 110 of second cell 104. Likewise, couplers may be present where one end of a qubit in the second set of qubits 120 is proximate to a first end of a qubit in a respective second set of qubits 120 of an adjacent cell. In some implementations, not all qubits and/or couplers may be functional or operational in an analog processor.

To simulate a cubic lattice in an analog processor, or a portion of an analog processor, such as the portion of an analog processor 100, ferromagnetic coupling strengths may be assigned to a subset of the couplers to form logical chains of qubits, or logical qubits. In at least one implementation, a logical qubit is formed of four qubits, with a pair of intersecting qubits in one cell and two other qubits in two different cells.

With reference to FIG. 1, a coupler 132 provides tunable communicative coupling between a first qubit 112a in set 110 and a first qubit 122a in set 120, and is assigned a first ferromagnetic coupling strength $J_1$, e.g., $J_1=-2$. Likewise, coupler 134 provides tunable communicative coupling between qubit 112a and a first qubits 112b in set 110 in adjacent cell 104 and is assigned the first ferromagnetic strength. Coupler 136 provides tunable communicative coupling between qubit 122a and a first qubit 122b in second set of qubits 120 in adjacent cell 106 and is assigned the first ferromagnetic strength. Qubits 112a, 112b, 122a and 122b form a chain of qubits, referred to as a logical qubit. In some implementations, a strong ferromagnetic coupling is assigned between qubits in the same chain so that in a low energy-state all the qubits in the chain of qubits will take the same spin value to form a new logical variable, or logical qubit. A similar process may be followed to embed other logical qubits in an analog processor.

When one or more logical qubits are communicably coupled together a three dimensional structure may be formed.

With reference to FIG. 1, each logical qubit (e.g., logical qubit 112a-112b-122a-122b) is communicatively coupled to at least one other logical qubit. Couplers that provide tunable communicative coupling between logical qubits are assigned a second coupling strength $J_2$. In some implementations, the second coupling strength is smaller in magnitude than the first ferromagnetic coupling strength (e.g., $-1<J_2<+1$).

FIG. 1 shows a possible embedding of a cubic lattice wherein each logical qubit is communicatively coupled to at least three other logical qubits. For example, coupler 138 provides tunable communicative coupling between logical qubit 112a-112b-122a-122b and another logical qubit in a cell adjacent to cell 106. It is understood that logical qubits that are not in a cell at the edge of an analog processor may be coupled to more than three other logical qubits (e.g., six logical qubits).

Figure 2:
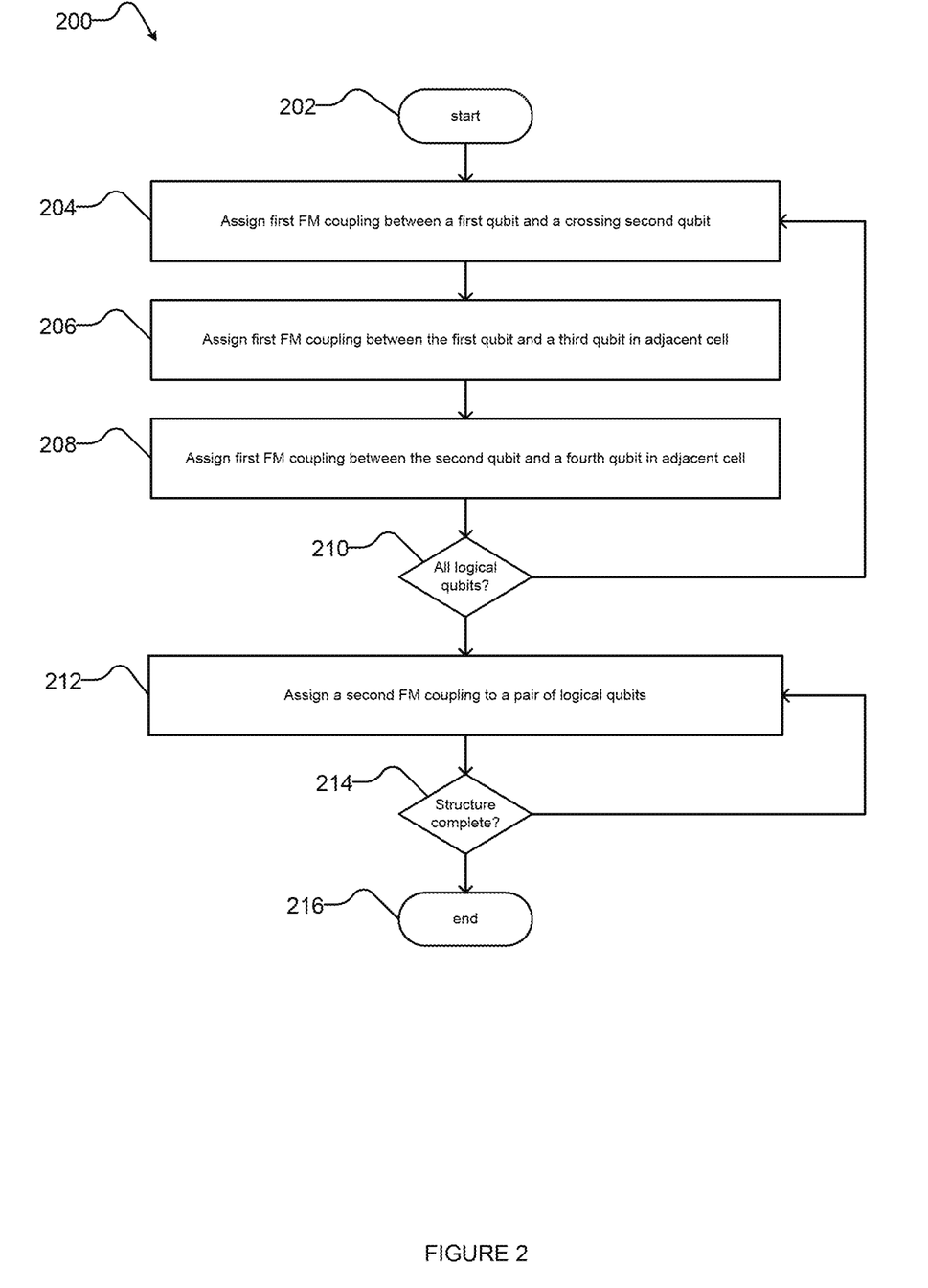
FIG. 2 is a flow chart illustrating an example method of operation to embed a three dimensional structure (e.g., a cubic lattice) in an analog processor comprising qubits and couplers.

FIG. 2 shows an example method of operation 200 to embed a three dimensional structure (e.g., a cubic lattice) in an analog processor comprising qubits and couplers. The analog processor may be a quantum processor. Method 200 is described with reference to FIG. 1, however, a person skilled in the art will understand that method 200 may be applied to analog processors having a different topology.

Method 200 comprises acts 202-216. It will be appreciated that the depicted method 200 is exemplary and, in some implementations, certain acts may be omitted, further acts may be added, and/or the order of the acts may be changed. Method 200 may be executed by a hybrid computing system comprising an analog processor and at least one digital processor, where the digital processor may program the analog processor by assigning coupling strengths to the couplers and biases to the qubits. The analog processor may be a quantum processor.

Method 200 starts at 202, for example in response to a call from another routine.

At 204, a first ferromagnetic coupling strength is assigned or applied to a coupler (e.g., coupler 132 of FIG. 1) to provide communicative coupling strength between a first qubit (e.g., qubit 112a of FIG. 1) and a second qubit (e.g., qubit 122a of FIG. 1) within the same cell (e.g., cell 102). The coupler may be proximate a region where the first qubit crosses the second qubit. In some implementations, the first qubit is orthogonal the second qubit.

At 206, the first ferromagnetic coupling strength is assigned or applied to a coupler (e.g., coupler 134 of FIG. 1) to provide communicative coupling strength between the first qubit (e.g., qubit 112a of FIG. 1) and a third qubit (e.g., qubit 112b of FIG. 1) within an adjacent cell (e.g., cell 104).

At 208, the first ferromagnetic coupling strength is assigned or applied to a coupler (e.g., coupler 136 of FIG. 1) to provide communicative coupling strength between the second qubit (e.g., qubit 122a of FIG. 1) and a fourth qubit (e.g., qubit 122b of FIG. 1) within an adjacent cell (e.g., cell 106).

At 210, a check is performed, for example by the hybrid computing system, to ensure that all logical qubits needed to embed the three dimensional structures have been constructed. If all the needed coupling strength have been assigned to form the needed number of logical qubit control passes to 212, otherwise to 204, where a different logical qubit is constructed. Alternatively, when for three-dimensional structures that require or benefit from logical qubits formed by more than 3 qubits, acts 204-208 need to be repeated as needed to form a logical qubit of any size.

At 212, a second coupling strength is assigned or applied to a coupler (e.g., coupler 138 of FIG. 1) to provide tunable communicative coupling between a logical qubit (e.g., logical qubit 112a-112b-122a-122b of FIG. 1) and a different one of the logical qubits formed at acts 204-208.

At 214, a check is performed, for example by the hybrid computing system, to ensure that all logical qubits needed to embed the three dimensional structure have been communicatively coupled by assigning or applying the second coupling strength. If the three dimensional structure is complete, control passes to 216, otherwise to 212, where more couplers between logical qubits are programmed with the second coupling strength.

At 216, method 200 terminates, until it is for example invoked again.

Method 200 may be used to explore system dynamics and mitigate or attempt to mitigate the effects of degeneracy. For example, an embedding of a three dimensional structure may be used to measure magnetic susceptibility ($\chi$) of a system. Such a system may be an analog processor, in particular a quantum processor.

Susceptibility $\chi$ is a characteristic of some types of qubits, including flux qubits, which describes the degree of magnetization of a qubit in response to an applied magnetic field. This response may vary in different circumstances (e.g., depending on the strength and topology of its couplings with other qubits, the flux biases of other qubits). Thus, a qubit's susceptibility $\chi$ may be different for different problems. Therefore, it may be advantageous to measure or determined the susceptibility $\chi$ in order to attempt to mitigate degenerative effects for certain classes of problems.

Figure 3A:
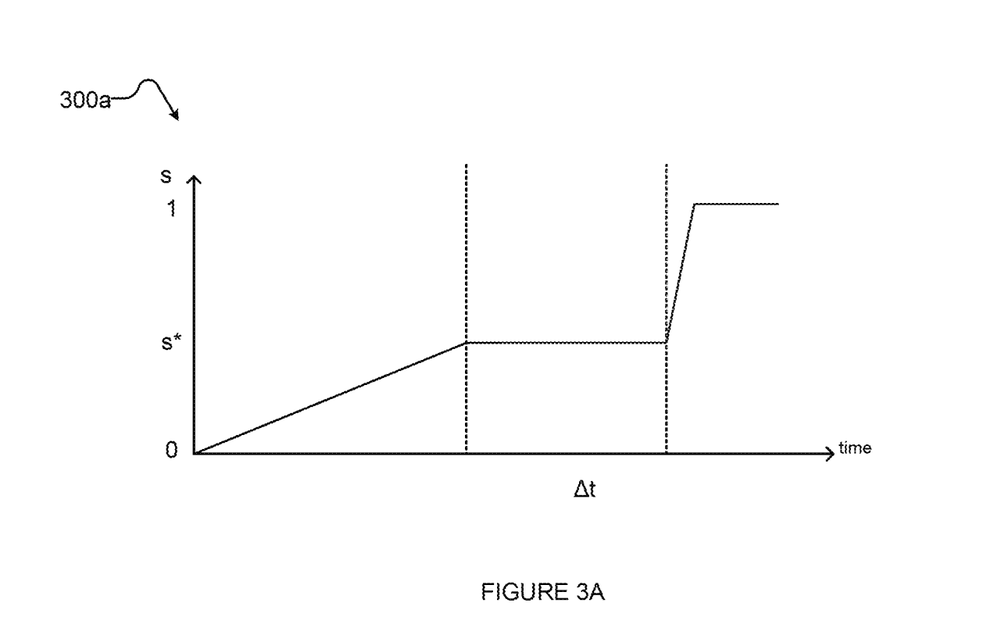
FIG. 3A is a graph illustrating an exemplary evolution schedule applied to an analog processor to determine magnetization statistics.

FIG. 3A is a graph illustrating an exemplary evolution schedule 300a applied to the qubits in an analog processor determine magnetization statistics. A person skilled in the art will understand that example evolution schedule may be applied the example embedding of FIG. 1 and/or to other embeddings or embedded problems of three-dimensional structures.

As illustrated in FIG. 3A, the evolution schedule applied to the qubits in the analog processor proceeds until a value s* of the annealing coefficient s, where $0 \leq s \leq 1$. The value s* may be an intermediate point in the evolution of the analog processor. This first part of the evolution of the analog processor may be linear. In some implementations, the evolution proceeds slowly, for example with $10^{-5}s < \text{slope} < 10^{-2}s$.

Figure 3B:
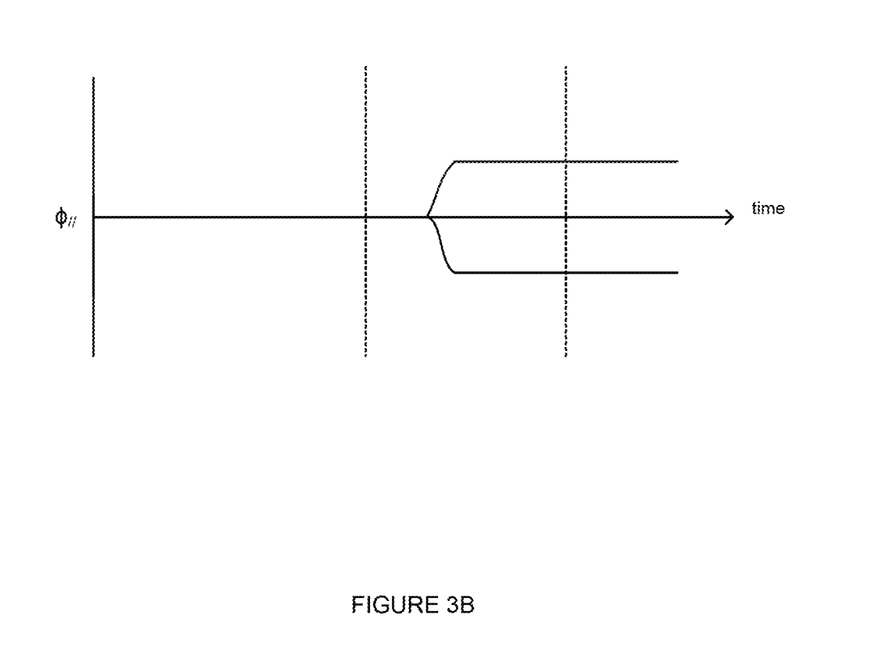
FIG. 3B is a graph illustrating an exemplary application of longitudinal field to the qubits in an analog processor to determine magnetization statistics.

At s*, the evolution of the analog processor is paused for a time $\Delta t$. During the time $\Delta t$ a longitudinal flux $\pm\phi_{//}$ is applied to all qubits in the analog processor, as shown in FIG. 3B. In some applications, the time $\Delta t$ may be in the order of 1 ms. It is understood that when only a portion of the analog processor is used with evolution schedule 300a, then $\pm\phi_{//}$ only needs to be applied to the qubits in the used portion of the analog processor.

After time $\Delta t$ the evolution is ramped until s=1. The ramp operation advances the evolution quickly, for example in the order of 500 ns.

FIG. 3B is a graph illustrating an exemplary application of longitudinal field $\pm\phi_{//}$ to the qubits in an analog processor to determine magnetization statistics. Longitudinal field $\pm\phi_{//}$ is applied to match anti-ferromagnetic orderings in the qubits of the analog processor. The qubits in the analog processor may have been configured so as to simulate a three-dimensional structure, as disclosed with reference to FIG. 1 and FIG. 2.

Evolution schedule 300a may be applied a plurality of times for different values of s* and the magnetization statics measured or determined as a function of s*.

Figure 4:
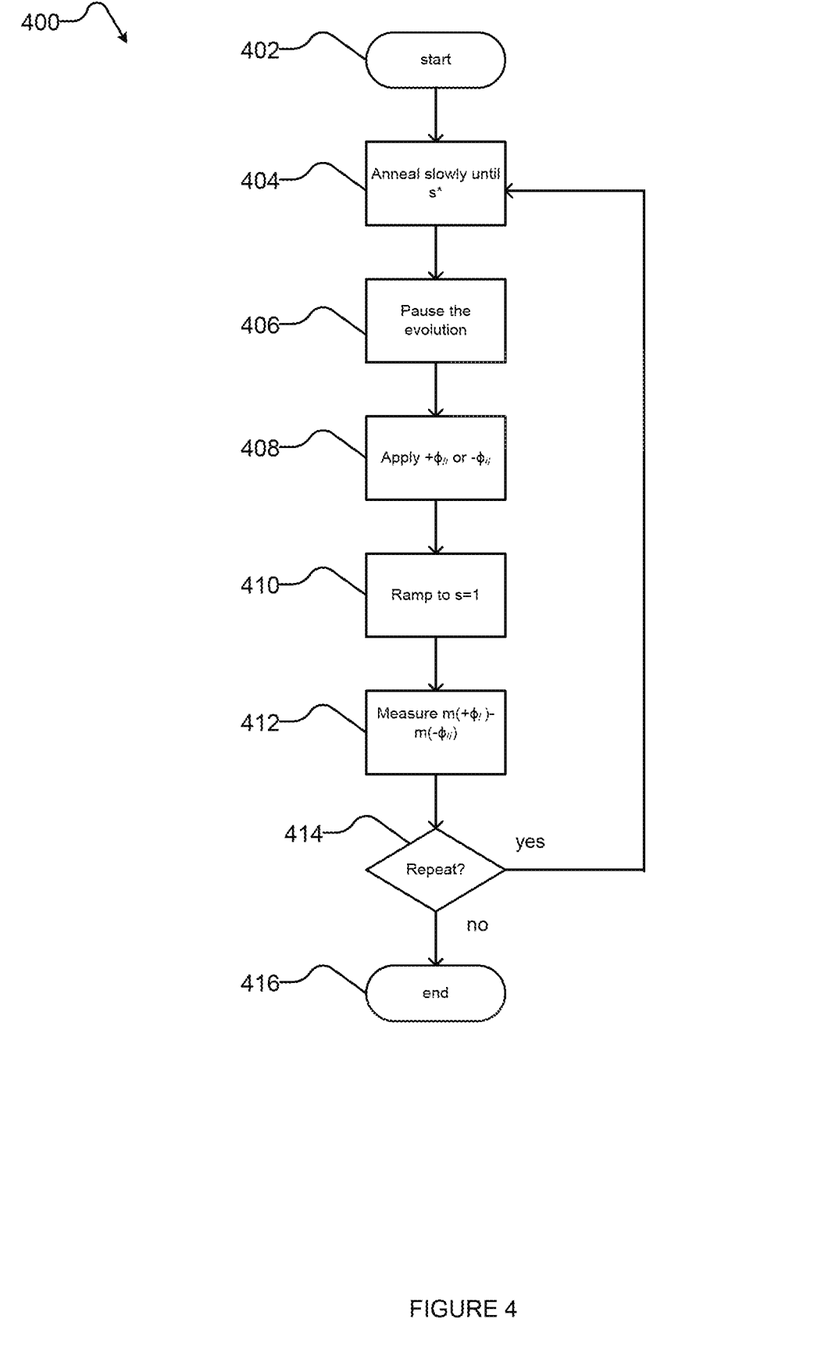
FIG. 4 is a flow chart illustrating an example method of operation to apply an evolution schedule and longitudinal field to match anti-ferromagnetic ordering.

FIG. 4 shows an example method of operation 400 to apply an evolution schedule and longitudinal flux. Method 400 may be employed to study magnetization statistics. Method 400 is described with reference to FIGS. 3A and 3B;

however, method 400 may be employed with evolution schedules different from evolution schedule 300a.

Method 400 comprises acts 402-416. It will be appreciated that the depicted method 400 is exemplary and, in some implementations, certain acts may be omitted, further acts may be added, and/or the order of the acts may be changed. Method 400 may be executed by a hybrid computing system comprising an analog processor and at least one digital processor, where the digital processor may program the analog processor by assigning coupling strengths to the couplers and biases to the qubits. The analog processor may be a quantum processor.

Method 400 starts at 402, for example in response to a call from another routine. Method 400 may receive a set of values s* as part of a set of input. The hybrid system may also receive an embedding of a three-dimensional structure, as disclosed above with reference to FIG. 1, in which case the hybrid computing system may apply the received embedding, for example via method 200.

At 404, the hybrid computing system evolves the analog processor until a value s* of the annealing coefficient. The value s* may be determined by the digital processor, for example based on a class of problems, or received at 402 as part of a set of inputs.

At 406, the hybrid computing system pauses the evolution of the analog processor for a time $\Delta t$. During $\Delta t$ the value of the annealing coefficient remains constant to the value s*.

At 408, the hybrid computing system applies a longitudinal flux $\pm\phi_{//}$ to the qubits in the analog processor. In some implementations, the value of $\pm\phi_{//}$ can be less than $100\mu\Phi$).

At 410, the hybrid computing system resumes the evolution schedule after time $\Delta t$ by ramping, e.g., annealing quickly, the evolution until s=1.

At 412, the hybrid computing system measures or determines the difference in magnetization statistics of qubits in the analog processor for the value s*. The difference may be calculated by subtracting the magnetization observed with one longitudinal flux $+\phi_{//}$ from the magnetization observed with the other longitudinal flux $-\phi_{//}$.

At 414, the hybrid computing system determines whether to repeat acts 404 to 412 with different values of s*. A possible test to determine whether repeat the execution of method 400 is to determine whether all the values s* of interest have been considered. In this case, control passes to 416, otherwise to 404.

At 416, method 400 terminates, until it is for example invoked again. Measurements taken via method 400 may be used to calculate or infer the susceptibility $\chi$ for the system and for the problem embedded into the analog processor for a given s*.

Figure 5:
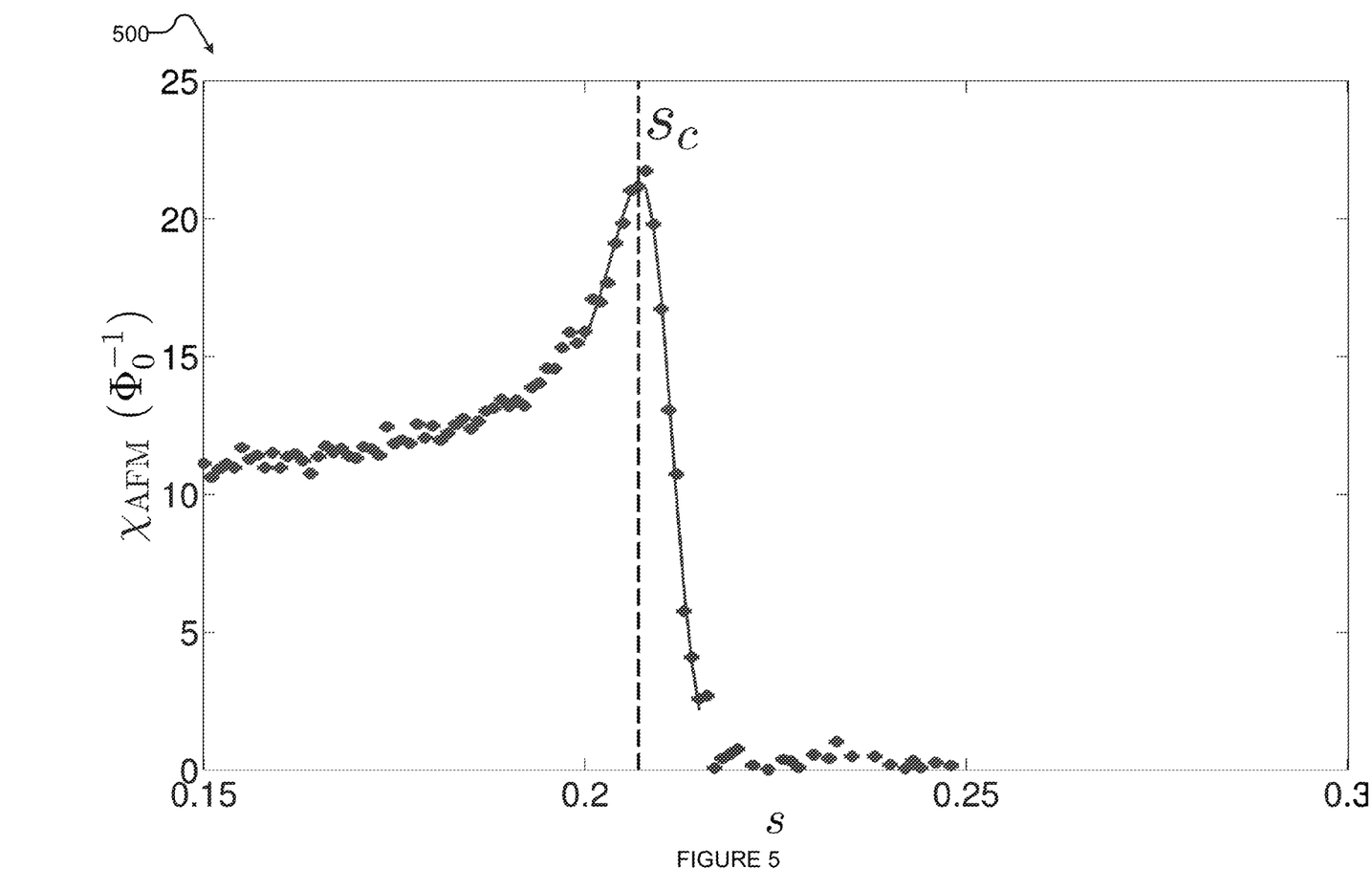
FIG. 5 is a graph illustrating comparative results of susceptibility $\chi$ versus an annealing parameter s, according to the present systems, methods and apparatus.

FIG. 5 is a graph 500 illustrating example results of susceptibility $\chi$ versus the annealing parameter s, according to the present systems, methods and apparatus.

The susceptibility $\chi$ is plotted on the vertical axis and the annealing coefficient on the horizontal axis. The curve on graph 500 is representative of a value of doping p, where $0 \le p \le 1$ represents the probability of antiferromagnetic ordering of spins and p=0 represents perfect antiferromagnetic ordering. (The particular p used for this plot was 0.30.) As illustrated in graph 500, the sharp peak in the curve is representative of a transition between two distinct magnetic phases. This transition may lead to degeneracy on certain problems. The peak on graph 500 is indicative of a critical value $s_c$ of the evolution coefficient s, where this phase transition is more likely. Thus, it may be desirable under certain conditions to pause or slow down the system evolution around the value $s=s_c$.

Graph 500 and/or method 400 may therefore be employed to discover or attempt to the discover a critical value of the annealing coefficient s. This result may be employed to attempt reduce degeneracy in a system. In particular, the teachings of International Patent Application No. US2016/059169 may be employed to modify annealing schedules to attempt to mitigate degeneracy.

Figure 6:
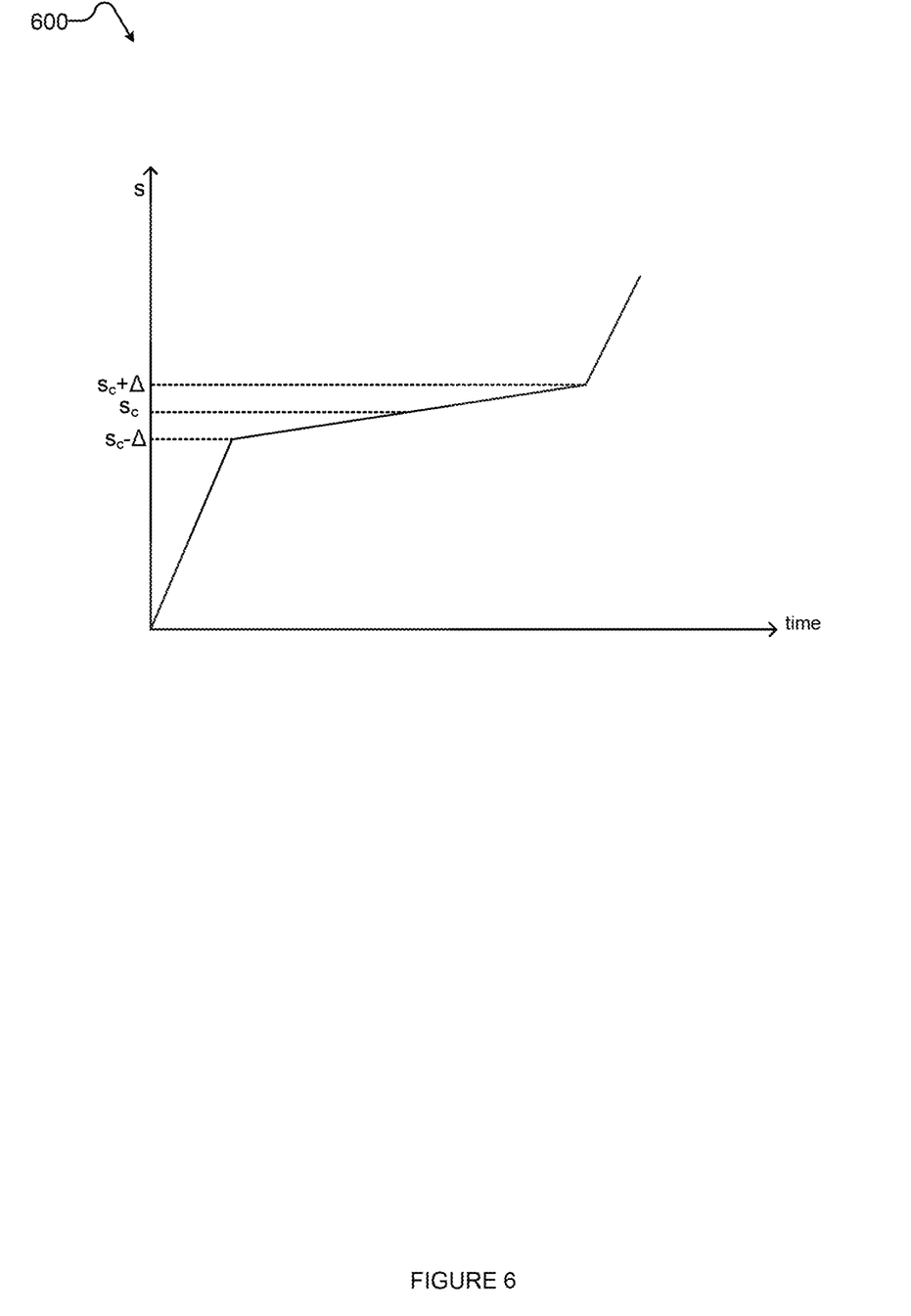
FIG. 6 is a graph of an example modified evolution schedule of a problem based on the critical value of an annealing parameter s.

FIG. 6 is a graph of an example annealing schedule 600 of a problem that has been modified based on the critical value $s_c$ of an annealing parameter s. Evolution schedule 600 may be used with or after method 400 to attempt to mitigate degeneracy. A person skilled in the art will understand that other types of evolution schedules may be employed and this application and appended claims are not limited to evolution schedule 600. Evolution schedule 600 may be applied to an analog processor, for example a quantum processor.

In evolution schedule 600, an analog processor starts evolving from s=0 until a value $s_c-\Delta$, where $s_c$ is the critical value of the annealing coefficient s at which a phase transition between two distinct phases is likely. Optionally, the evolution until time $s_c-\Delta$ may be a ramp evolution.

At $s_c-\Delta$ the evolution of the analog processor is slowed until the annealing coefficient reaches value $s_c+\Delta$, after which the evolution may resume with the same rate as before $s_c-\Delta$, or with a different rate. A person skilled in the art will understand that the size of the interval ($s_c-\Delta$, $s_c+\Delta$) is shown in FIG. 6 for illustration purposes only and in other implementation this interval may be larger or smaller, in an attempt to mitigate the effect of degeneracy.

Figure 7:
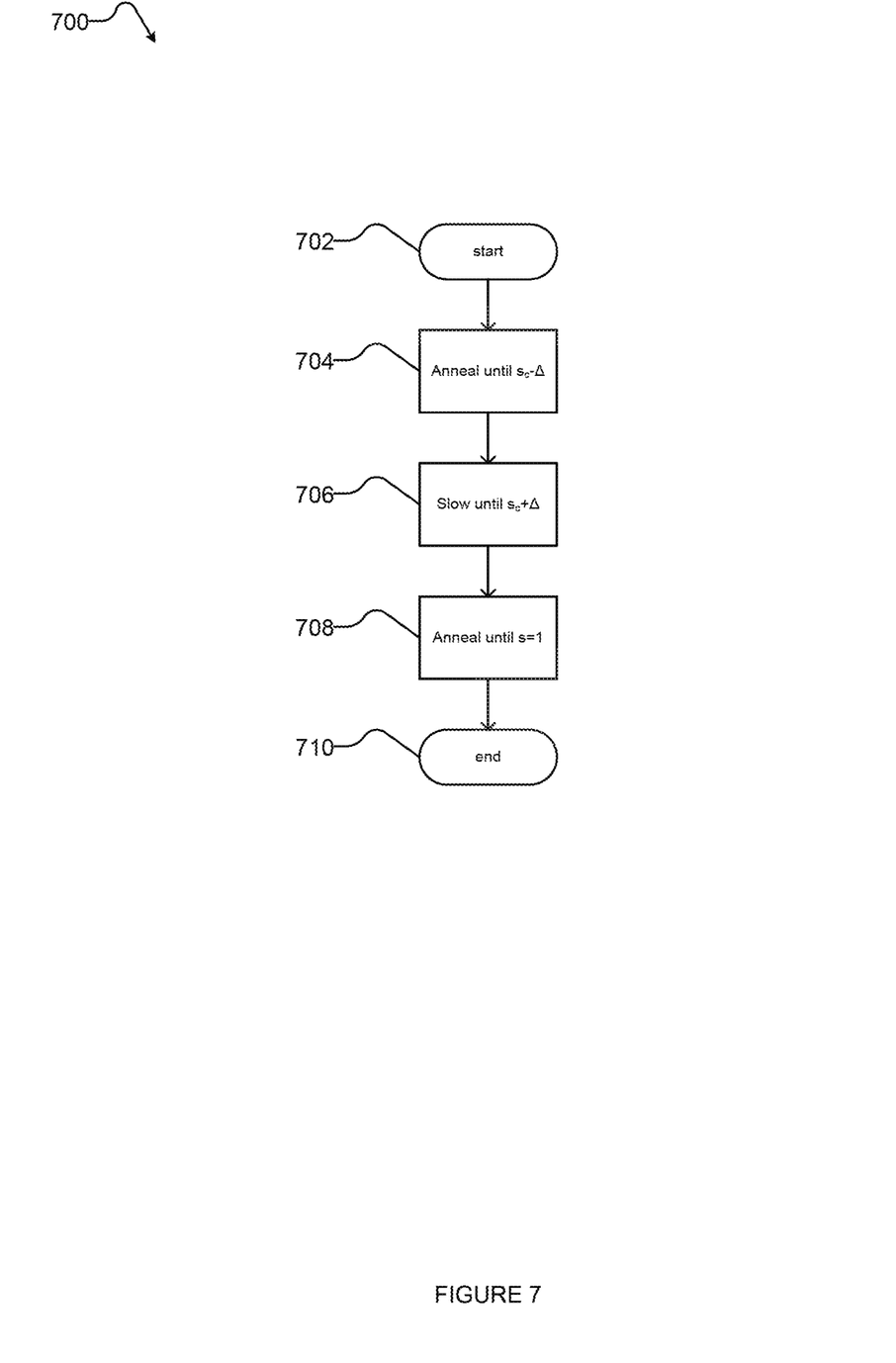
FIG. 7 is a flow chart of an example method of operation to modify the evolution schedule of a problem based on the critical value of an annealing parameter s.

FIG. 7 shows an example method of operation 700 to modify an evolution schedule of a problem based on the critical value of an annealing parameter $s_c$. FIG. 7 will be described with reference to FIG. 6.

Method 700 comprises acts 702-710. It will be appreciated that the depicted method 700 is exemplary and, in some implementations, certain acts may be omitted, further acts may be added, and/or the order of the acts may be changed. Method 700 may be executed by a hybrid computing system comprising an analog processor and at least one digital processor, where the digital processor may program the analog processor by assigning coupling strengths to the couplers and biases to the qubits. The analog processor may be a quantum processor. The qubits and couplers on the analog processor may be configured so as to simulate a three-dimensional structure as disclosed above with reference to FIG. 1 and FIG. 2.

Method 700 starts at 702, for example in response to a call from another routine.

At 704, the hybrid computing systems starts the evolution of the analog processor until a value of the annealing coefficient $s_c-\Delta$. As illustrated in FIG. 6, at 704 the analog processor may evolve quickly (e.g., ramp) to $s_c-\Delta$.

At 706, the hybrid computing system slows the evolution of the analog processor until the annealing coefficient reaches value $s_c+\Delta$.

At 708, the hybrid computing system resumes the evolution of the analog processor until s=1. After $s_c+\Delta$, the analog processor may evolve with the same rate as from s=0 to $s_c-\Delta$ or with a different rate.

Method 700 terminates at 710, until it is for example invoked again.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

Applications of the systems and methods described above include, for example, materials simulation. For instance, an analog processor may simulate the properties of a three-dimensional system of molecules with magnetic moment axes (such as a three-dimensional quantum spin glass material or a ferromagnet) by representing the material as a three-dimensional cubic lattice as described above. The processor may further simulate the material being in a magnetic field, for instance by applying per-qubit flux biases corresponding to the strength of the magnetic field (and thereby applying a physical magnetic field in a flux-qubit-based analog processor). In the case of a quantum processor, simulating a magnetic field (and/or certain other conditions) can potentially induce quantum fluctuations in the simulated material, which may affect its phase boundaries and/or critical points.

Doping of simulated materials may be simulated by setting couplers between certain logical qubits to an antiferromagnetic (AFM) or zero coupling. Simulating doping may allow for simulating materials with impurities, structural irregularities, and/or other physical characteristics. Doped couplings may be set randomly or pseudo-randomly, for example based on a doping ratio p. For instance, p=0.5 may indicate that each coupler has a 50% probability of being doped (and a corresponding 50% probability of being set to the [ferromagnetic] second coupling strength discussed above with reference to FIGS. 1 and 2).

As noted above, the susceptibility $\chi$ of qubits can undergo phase transitions during the evolution of the processor. By producing susceptibility values for various annealing coefficient values s, transverse fields $\Gamma$, and/or temperatures T, the processor can provide a user with empirical data on phase transitions for the simulated material under various simulated conditions. Such techniques are not limited to materials represented by cubic lattices, and may be applied to models of physical materials with other topologies.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, U.S. patent applications, foreign patents, and foreign patent applications referred to in this specification and/or listed in the Application Data Sheet are incorporated herein by reference, in their entirety, including but not limited to: International Patent Application No. US2016/059169, International Patent Application WO2006066415, U.S. Pat. Nos. 9,170,278, 9,178,154, and U.S. Patent Application Ser. No. 62/451,518.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of simulating a physical material in an analog processor comprising a plurality of qubits, the method comprising:
   forming a set of logical qubits, one or more of the logical qubits formed by assigning a first ferromagnetic coupling strength to one or more couplers communicatively coupling at least one qubit in the plurality of qubits;
   forming a three-dimensional structure corresponding to a model of the physical material by coupling each logical qubit to at least one other logical qubit by assigning a second coupling strength to each of a first set of couplers communicatively coupling pairs of logical qubits based on the model of the physical material;
   evolving a state of the analog processor from a first state until a value of the annealing coefficient s reaches s*, wherein s is a coefficient that controls a rate of evolution from an initial Hamiltonian $H_i$ and a final Hamiltonian $H_f$ according to $H_e=(1-s)H_i+sH_f$ wherein $H_e$ is an evolution Hamiltonian, and s* is an intermediate point in the evolution of the analog processor;
   pausing the evolution of the analog processor;
   applying a longitudinal flux to one or more of the plurality of qubits of the analog processor;
   resuming evolving the state of the analog processor to a second state;
   measuring one or more characteristics of the set of logical qubits at the second state; and
   determining a property of the physical material based on the one or more characteristics.

2. The method of claim 1 wherein applying a longitudinal flux to one or more of the plurality of qubits of the analog processor includes applying a longitudinal flux to one or more of the plurality of qubits of the analog processor based on a magnetic field represented in the model of the physical material.

3. The method of claim 1 wherein coupling each logical qubit to at least one other logical qubit further comprises assigning a first antiferromagnetic coupling strength to each of a second set of couplers communicatively coupling pairs of logical qubits based on a doping characteristic of the model of the physical material.

4. The method of claim 3 wherein the doping characteristic comprises a probability that a given one of the second set of couplers is doped.

5. The method of claim 1 wherein coupling each logical qubit to at least one other logical qubit further comprises assigning a zero coupling strength to each of a second set of couplers communicatively coupling pairs of logical qubits based on a doping characteristic of the model of the physical material.

6. The method of claim 1 wherein the one or more characteristics comprise a magnetic susceptibility of at least one of the plurality of qubits.

7. The method of claim 1 wherein the property of the physical material comprises a phase transition response of the simulated material to a simulated condition.

* * * * *